United States Patent [19]

Akatsuka

[11] Patent Number: 4,718,043
[45] Date of Patent: Jan. 5, 1988

[54] MEMORY CIRCUIT WITH IMPROVED POWER-DOWN CONTROL

[75] Inventor: Yasuo Akatsuka, Tokyo, Japan

[73] Assignee: NEC Corporation, Tokyo, Japan

[21] Appl. No.: 792,401

[22] Filed: Oct. 29, 1985

[30] Foreign Application Priority Data

Oct. 29, 1984 [JP] Japan ................................. 59-227303

[51] Int. Cl.⁴ ............................................. G11C 13/00
[52] U.S. Cl. ...................................... 365/227; 307/66
[58] Field of Search ............... 365/226, 227, 228, 229, 365/189; 307/66

[56] References Cited
U.S. PATENT DOCUMENTS 4,451,742 5/1984 Aswell ........................... 365/229 X Primary Examiner—Joseph A. Popek
Attorney, Agent, or Firm—Sughrue, Mion, Zinn, Macpeak & Seas

[57] ABSTRACT

An improved memory circuit having power-down mode is disclosed. The memory is of the type having a memory cell matrix and a peripheral circuit for achieving access operation to the memory cell matrix under control of at least one control signal and is featured in that a power supply to at least a part of the peripheral circuit is stopped only when the control signal is kept inactive for a predetermined period or more, reducing the power consumption in the memory.

9 Claims, 8 Drawing Figures

MEMORY CIRCUIT WITH IMPROVED POWER-DOWN CONTROL

BACKGROUND OF THE INVENTION

The present invention relates to a memory circuit and particularly to a memory circuit having a power-down mode in which power consumption is reduced in a non-selected state.

Access mode and stand-by mode of memory circuits are controlled by a chip selection signal. In access mode, peripheral circuits such as address decoders, output circuits are enabled as well as memory cells, and access operations to memory cells are conducted. In stand-by mode, power supply to a peripheral circuit is stopped while maintaining power supply to memory cells so that access to the memory cell is inhibited. This feature of the stand-by mode contributes to power reduction when the memory circuit is not accessed. In this sense, this stand-by mode is also referred to as "power-down mode".

In addition to the reduction of power consumption, many efforts have been paid to improve access time. Access time has been discussed in two categories. One is the so-called address access time which is the access time from a time point when address information to the memory circuit is established under the state that the memory circuit is enabled by a chip selection signal. The other is the so-called chip selection access time which is the access time from a time point when the memory circuit is switched to the enabled state by the chip selection signal while address information has been established prior to the enabled state.

In recent microcomputer systems, it has been routine to apply address information and a chip selection signal to a memory employed therein in such manner that address information is first applied to the memory and thereafter the memory is enabled by the chip selection signal. Therefore, access time to the memory is substantially determined by the chip selection access time. Thus, when a memory circuit is used in such a system, the chip selection access time has significance and is required to be faster than the address access time.

However, in conventional memory circuits, it has been difficult to achieve desired chip selection access time because the peripheral circuits of the memory circuit are changed from a non-powered state to a powered, enabled state a predetermined time after from the control of the chip selection signal. Thus, it has been difficult to provide a memory circuit which consumes less power in stand-by mode and simultaneously, has the feature that the chip selection access time is faster than the address access time.

SUMMARY OF THE INVENTION

It is an object of the present invention to provide a memory circuit having faster chip selection access time than address access time.

The memory circuit of the invention is of the type having a memory cell matrix, a peripheral circuit for performing an access operation to the memory cell matrix under control of at least one control signal, and is featured by a detection circuit for detecting that the above at least one control signal is kept at a inactive level for a predetermined period and a power supply control circuit responsive to the detection output of the detection circuit for stopping supply of power to at least a part of the peripheral circuit.

According to the invention, when the above control signal is kept a inactive level for a predetermined period or more, the memory circuit is generally laid in a complete non-selection state and in this state the possibility that the memory circuit will be selected soon is very small. Therefore, in this instance the power supply to the memory can be cut without any problem.

According to one aspect of the invention, in the case where a chip selection signal, a write enable signal and an output enable signal are used to control the memory circuit, the detection circuit is adapted to detect the states of the above three signals. In that case, when all of the above signals are kept at an inactive level, the power supply to at least part of the peripheral circuit is stopped.

DETAILED DESCRIPTION OF THE INVENTION

Figure 1:
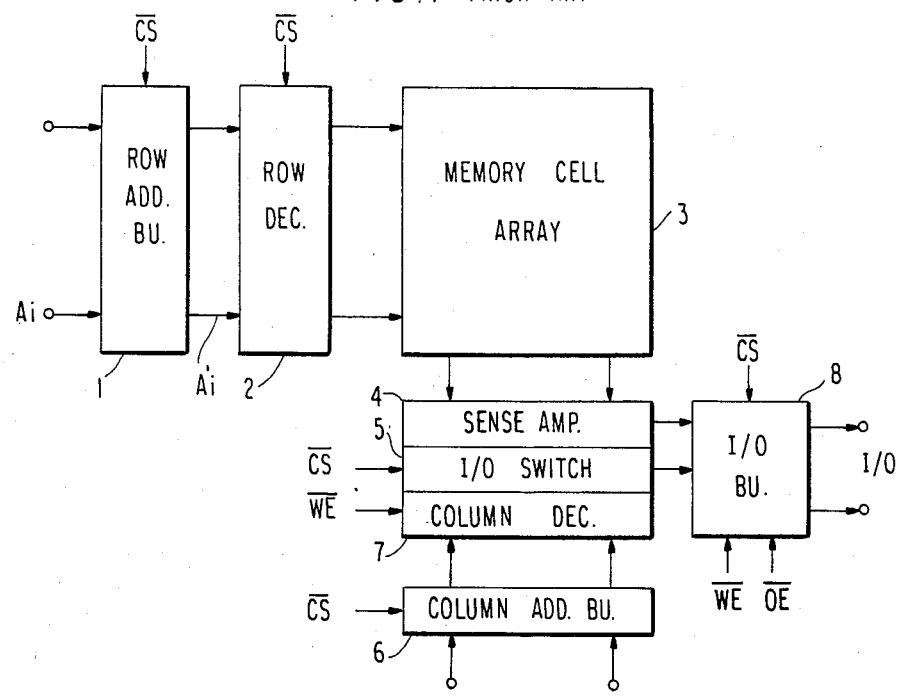
FIG. 1 is a schematic block diagram of a memory circuit according to the prior art.

Referring to FIG. 1, an example of a prior art memory circuit is explained.

The memory is basically composed of an array 3 of memory cells, a row address buffer 1, a row decoder 2, a sense amplifier section 4, a column address buffer 6, a column decoder 7, an I/O switch section 5 and an I/O buffer 8 in a known manner. To the row address buffer 1, the column address buffer 6, the column decoder 7, the sense amplifier section 4 and the I/O buffer 8, a chip selection signal $\overline{CS}$ is applied. The signal $\overline{CS}$ is of the low active type signal and enables the circuit blocks 1, 6, 7, 4 and 8 when it is low and disables them when it is high in level.

The sense amplifier section 4, the I/O switch 5 and the I/O buffer 8 are also controlled by a write enable signal $\overline{WE}$ between a read mode and a write mode. The write mode is introduced in response to a low level of $\overline{WE}$ while the read mode is introduced in response to a high level of $\overline{WE}$. Furthermore, the I/O buffer 8 is controlled by an output enable signal $\overline{OE}$. The buffer 8 operates in the read mode when $\overline{OE}$ is low.

Selection and non-selection of the memory are achieved by enabling and disables operation of each of the functional blocks in accordance with the low and high levels of the chip selection signals $\overline{CS}$. Reduced power consumption of the memory at the time of the non-selection is accomplished by stopping the supply of power to each peripheral block, and this control is performed by the high level of $\overline{CS}$. This structure is directed particularly to accomplish low power consumption.

Figure 2:
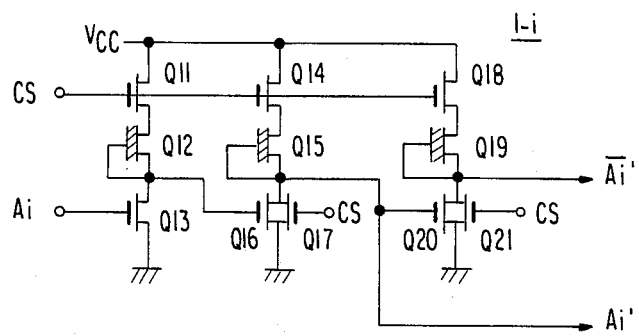
FIG. 2 is a schematic circuit diagram of an address buffer employed in the memory of FIG. 1.

One bit structure of the row address buffer 1 is illustrated in FIG. 2. The one bit adders buffer $1_{-i}$ is composed of field effect transistors $Q_{11}$ to $Q_{21}$. The transistors $Q_{11}$ to $Q_{13}$ form a first stage of inverter, and transistors $Q_{14}$ to $Q_{17}$ and $Q_{18}$ to $Q_{21}$ form second and third stages of inverters, respectively. The transistors $Q_{11}$, $Q_{14}$ and $Q_{18}$ are controlled by a control signal CS complementary to the chip selection signal $\overline{CS}$ and serve as power supply switches to the first to third stages of inverters. The transistors $Q_{17}$ and $Q_{21}$ controlled by $\overline{CS}$ serve as reset transistors for outputs $A'_i$ and $A'_i$. In the non-selection mode, the signals $\overline{CS}$ and CS are rendered high and low so that the transistors $Q_{11}$, $Q_{14}$ and $Q_{18}$ are rendered non-conductive to cut the power supply to the first to third stage inverters. When the mode is switched from the non-selection mode to the selection mode, the power supply $V_{CC}$ to the first to third stage inverters is initiated and a predetermined time after the first to the third stage inverters are laid in operating state. Then, in response to the input $A_i$, the outputs $A'_i$ and $A'_i$ are produced after operation times of first to third stage inverters in cascade. Thus, the outputs $A'_i$ and $A'_i$ are produced after a relatively large period of time has elapsed from the application of the low level of $\overline{CS}$. On the contrary, it is possible to eliminate the delay time due to the switching of the switching to the first to third stage inverters by directly connecting drains of the transistors $Q_{12}$, $Q_{15}$ and $Q_{19}$ to $V_{CC}$. However, in such case, the address buffers always consume power even in the nonselection mode, failing to reduce the power consumption.

As described above, it has been difficult to provide a memory circuit which consumes less power in non-selection or stand-by mode and which has at the same time, the feature that the chip selection access time is faster than the address access time.

Figure 3:
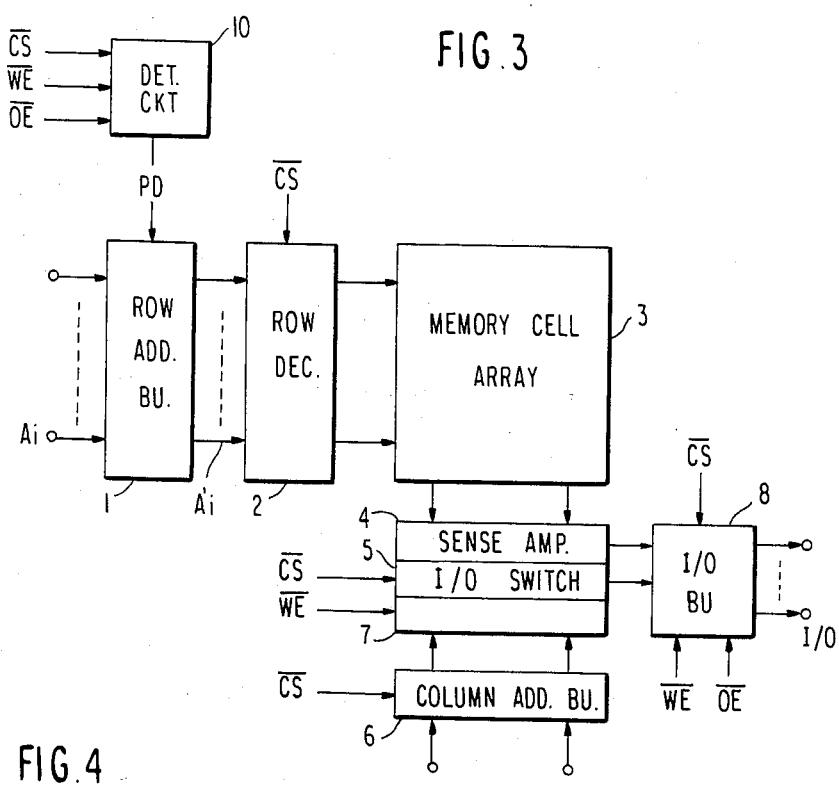
FIG. 3 is a schematic block diagram of a memory according to one embodiment of the present invention.
Figure 4:
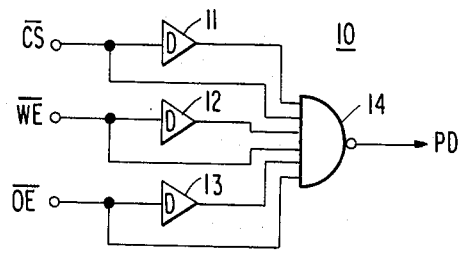
FIG. 4 is a schematic circuit diagram of an address buffer control circuit employed in the memory of FIG. 3.

Referring to FIGS. 3 and 4, the memory according to the present invention is explained.

FIG. 3 shows a block diagram of the memory of the invention, in which portions corresponding to those in FIG. 1 are designated by the same reference numerals.

Figure 5:
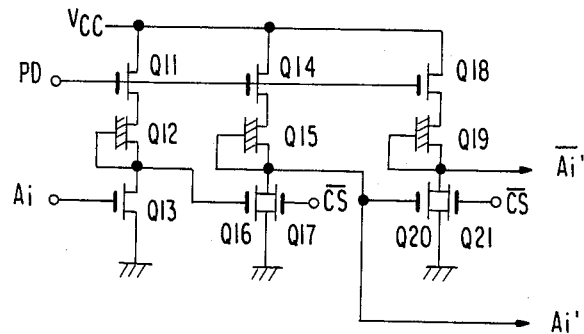
FIGS. 5 and 6 are schematic circuit diagrams of the address buffer employed in the memory of FIG. 3.

The present embodiment is achieved by controlling the row address buffer 1 by a control signal PD which is generated by the address buffer control circuit 10, instead of $\overline{CS}$. Namely, the address buffer control circuit 10 receives the signals $\overline{CS}$, $\overline{WE}$ and $\overline{OE}$ and produces a high level of the signal PD when at least one of the signals $\overline{CS}$, $\overline{WE}$ and $\overline{OE}$ assumes its active level, i.e. low level to enable the row address buffer 1. On the contrary, when all of the signals $\overline{CS}$, $\overline{WE}$ and $\overline{OE}$ assume their inactive levels i.e. high level, the circuit 10 produces a low level of the signal PD. Accordingly, the address buffer 1 is laid in non-operating state. In this case, as the buffer 1, the circuit of FIG. 2 is employed and instead of CS, the signal PD is applied to the gates of the transistors $Q_{11}$, $Q_{14}$ and $Q_{18}$, as illustrated in FIG. 5.

The structure of the control circuit 10 is shown in FIG. 4. The signals $\overline{CS}$, $\overline{WE}$ and $\overline{OE}$ are applied directly to inputs of a NAND gate 14 and also inputted to other inputs of the NAND gate 14 via delay circuits 11, 12 and 13, respectively.

The operation of this embodiment is explained below. When the period that all of the chip selection signal $\overline{CS}$, the write enable signal $\overline{WE}$ and the output enable signal $\overline{OE}$ are at an inactive high level, is longer than the delay time of the delay circuits 11 to 13, the NAND gate 14 produces a low level as PD. In response to the low level of PD, the power supply to the address buffer 1 is stopped. In contrast, if at least one of the signals $\overline{CS}$, $\overline{WE}$ and $\overline{OE}$ is at an active low level, or all of them are high but such period is shorter than the delay time of the delay circuits 11 to 13, the signal PD is high and therefore the power is applied to the buffer 1. Namely, when all of the signals $\overline{CS}$, $\overline{WE}$ and $\overline{OE}$ are at the inactive (high) level, the memory is laid in complete non-selection state and there is no prospect to turn the memory in selection state. Therefore, in this instance, the address buffer 1 can be set in non-operating state. On the contrary, when at least one of the signals $\overline{CS}$, $\overline{WE}$ and $\overline{OE}$ is rendered active (low), there is possibility that the memory will be brought into the selection mode soon. Therefore, in this instance, the power is applied to the buffer 1 and one address buffer can respond to the application of the input signals rapidly. Therefore, when the signal $\overline{CS}$ is changed to low, the address buffer 1 immediately produces its output. Thus, the chip selection access time can be faster than the address access time without increasing power consumption.

Figure 6:
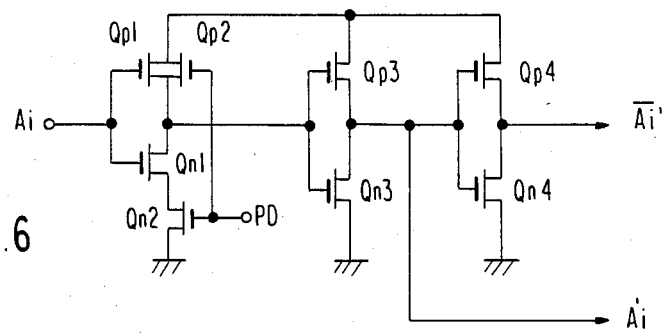

FIG. 6 shows another example of the address buffer 1. In this example, first to third stage inverters are of the so called CMOS type, in which transistors $Q_{P1}$ to $Q_{P4}$ are P-channel transistors and transistors $Q_{n1}$ to $Q_{n4}$ are N-channel transistors.

The effect of the memory circuit of the present invention can be easily understood when the operation on a memory board is considered.

Figure 7:
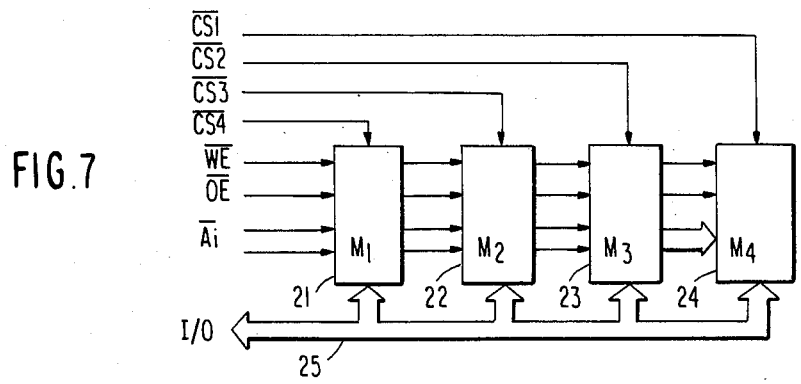
FIG. 7 is a schematic block diagram of an application system of the memory according to the invention.

FIG. 7 is a block diagram of a memory board having a plurality (four) of memory devices $M_1$ to $M_4$, which is useful for explaining the effect of the present invention. The four memory devices 21 to 24 ($M_1$ to $M_4$) use an I/O bus 25 in common, and the address input $A_i$, the write enable signal $\overline{WE}$ and the output enable signal $\overline{OE}$ are applied in common to these memory devices. The chip selection signals $\overline{CS1}$ to $\overline{CS4}$ for selecting these memory devices 21 to 24 are prepared by decoding the high-order address of an ordinary system, and are supplied to the memory devices, respectively.

Figure 8:
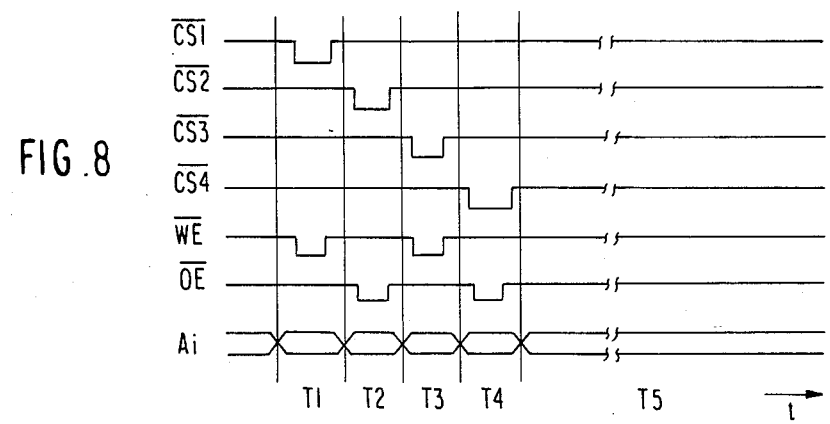
FIG. 8 is a timing chart showing operation of the system of FIG. 6.

FIG. 8 is a timing chart showing the operation of the memory board shown in FIG. 7. In the period T1, only the chip selection signal $\overline{CS1}$ and the signal $\overline{WE}$ are Low, so that the memory device 21 is selected and is under the write state. Similarly, in the periods T2, T3 and T4, the memory devices 22, 23 and 24 are selected and under the read state, the write state and the read state, respectively. In the subsequent period T5, since all the chip selection signals $\overline{CS1}$ to $\overline{CS4}$ are High, none of the memory devices are selected and the memory board is in the non-selection state. In such a case, the write enable signal $\overline{WE}$ and the signal $\overline{OE}$ are generally HIGH. In contrast, in the periods T1, T2, T3, T4, in which any of the memory devices is selected, or the period in which the memory board is selected, either one of the signal $\overline{WE}$ and the signal $\overline{OE}$ is essentially Low. Since the signal $\overline{WE}$ and the signal $\overline{OE}$ are supplied in common to the memory devices, at least one of the chip selection signal, the signal $\overline{WE}$ and the signal $\overline{OE}$ supplied to the memory devices is Low.

The above explains the outline of the operation of the memory boards in general. The present invention pays specific attention to the fact that when the memory board is in the selection state, at least one of the control signals is LOW, and when the memory board is in the non-selection state, all the control signals are High. In other words, when the memory board is in the non-selection state, all of the chip selection signal $\overline{CS}$, the write enable signal $\overline{WE}$ and the signal $\overline{OE}$ are High and the period has generally a certain length. Particularly in the case of a battery back-up system using a low voltage data retention function, the period ranges from several milliseconds to several days, and low power consumption is held for such an elongated non-selection period. Therefore, control may be made in such a fashion that the supply of power to the address buffer 1 is cut off in the non-selection state lasting more than several milliseconds. This several msec period is formed by a delay circuit, and is suitably from 1 to 5 msec.

Besides the power to the address buffer described in this embodiment, the present invention can also stop the power to the other blocks except the power that is necessary for the data retention by the memory cells. Hence, the effect of the present invention is remarkable. If the non-selection period is shorter than the period set by the delay elements, the power supply to the address buffer is continued, so that the chip selection access time is the access from the row decoder, and is faster than the address access time.

As described with reference to the embodiment, the present invention can provide a memory circuit which has low power consumption at the time of non-selection and yet has a faster chip selection access time than an address access time.

Incidentally, the present invention can be applied to various applications in addition to the embodiment described above. When the invention is applied to a CMOS memory, for example, its address buffer is constituted in the manner such as shown in FIG. 5, for example. Since the initial input stage is controlled by the control signal PD, the level of the address input need not be fixed by pull-up or the like, and system design becomes extremely easy.

I claim:

1. A memory circuit comprising:
  an array of memory cells;
  first means for receiving a chip selection signal having active and inactive levels;
  second means for receiving an output enable signal having active and inactive levels;
  third means for receiving a write enable signal having active and inactive levels;
  a peripheral circuit coupled to said first, second, and third means and to said array of memory cells for operatively performing an access operation to said array, said peripheral circuit conducting a read operation when both of said chip selection signal and said output enable signal are at said active level and conducting a write operation when both of said chip selection signal and said write enable signal are at said active level;
  detection means, coupled to said first, second, and third means, for detecting that all of said chip selection signal, write enable signal and said output enable signal are at said inactive level; and
  an operation control circuit, coupled to said detection means and said peripheral circuit, for operatively inhibiting said peripheral circuit from performing an access operation to said array when said detection means detects that all of said chip selection signal, said write enable signal, and said output enable signal are at said inactive level.

2. The memory circuit according to claim 1, in which said detection means includes a NAND circuit receiving said chip selection signal, said write enable signal and said output enable signal.

3. The memory circuit according to claim 1, in which said detection means includes first to third delay elements receiving said chip seletion signal, said write enable signal and said output enable signal, respectively, and a NAND circuit receiving said chip selection signal, said write enable signal, said output enable signal and outputs of said first to third delay elements.

4. The memory circuit according to claim 1, in which said peripheral circuit includes an address buffer.

5. A memory circuit comprising:
  an array of memory cells arranged in rows and columns;
  first means for receiving a chip selection signal having an active level and an inactive level;
  second means for receiving an output enable signal having an active level and an inactive level;
  third means for receiving a plurality of row address signals;
  fourth means for receiving a plurality of column address signals;
  a detection circuit coupled to said first means and said second means for generating a detection signal of a first level when both of said chip selection signal and said output enable signal have been at their inactive level for longer than a predetermined period, and generating a detection signal of a second level otherwise;
  a row address buffer coupled to said third means for operatively generating true and complementary levels of said row address signals when said detection circuit generates said detection signal of said second level, said row address buffer being disabled when said detection circuit generates said detection signal of said first level;
  a row decoder coupled to said first means, said row address buffer and said array for operatively selecting one of the rows of said array in accordance with the true and complementary levels of said row address signals when said chip selection signal is at its active level; and
  a column selection circuit coupled to said first means, said second means, said fourth means and said array in accordance with said column address signals for reading data therefrom when both of said chip selection signal and said output enable signal are at their active levels.

6. The memory circuit according to claim 5, wherein said detection circuit includes:
  a first delay circuit having an input receiving said chip selection signal received by said first means and an output;
  a second delay circuit having an input receiving said output enable signal received by said second means and an output; and
  a NAND circuit having a first input receiving said chip selection signal received by said first means, a second input coupled to the output of said first delay circuit, a third input receiving said output enable signal received by said second means, a fourth input coupled to the output of said second delay circuit, and an output from which said detection signal is output.

7. The memory circuit according to claim 5, in which said row address buffer includes:
  a first voltage terminal;
  a second voltage terminal;
  a first node;

an inverter circuit coupled between said first node and said second voltage terminal, said inverter receiving one of said row address signals; and a switch element coupled between said first node and said first voltage terminal, said switch element taking a conductive state in response to said detection signal of said second level and a non-conductive state in response to said detection signal of said first level.

8. A memory circuit comprising:

an array of memory cells arranged in rows and columns;

first means for receiving a chip selection signal having an active level and an inactive level;

second means for receiving a write enable signal having an active level and an inactive level;

third means for receiving a plurality of row address signals;

fourth means for receiviang a plurality of column address signals;

a detection circuit coupled to said first means and second means for generating a detection signal of a first level when both of said chip selection signal and said write enable signal have been at their inactive levels for longer than predetermined period and generating a detection signal of a second level otherwise;

a row address buffer coupled to said third means for operatively generating true and complementary levels of said row address signals when said detection circuit generates said detection signal of said second level, said row address buffer being disabled when said detection circuit generates said detection signal of said first level;

a row decoder coupled to said first means, said row address buffer and said array for operatively selecting one of the rows of said array in accordance with the true and complementary levels of said row address signals when said chip selection signal is at its active level; and a column selection circuit coupled to said first means, second means, fourth means and said array for operatively selecting at least one of the columns of said array in accordance with said column address signals for writing date thereto when both of said chip selection signal and said write enable signal are at their active levels.

9. A memory circuit comprising:

an array of memory cells;

first means for receiving a chip selection signal having an active level and an inactive level;

a detection circuit coupled to said first means for generating a detection signal of a first level when said chip selection signal has been at the inactive level for longer than a predetermined period and a detection signal of a second level otherwise;

a peripheral circuit coupled to said first means, said array and said detection circuit, said peripheral circuit being enabled to perform an access operation to said array when said chip selection signal is at the active level and said detection signal is at said second level, and disabled otherwise; and a switch circuit coupled to a part of said peripheral circuit and said detection circuit, said switch circuit being enabled to supply a power voltage to a part of said peripheral circuit when said detection signal is at said second level and disabled to isolate said pwer voltage from said part of said peripheral circuit when said detection signal is at said first level.

* * * * *

UNITED STATES PATENT AND TRADEMARK OFFICE
CERTIFICATE OF CORRECTION

PATENT NO. : 4,718,043

DATED : January 5, 1988

INVENTOR(S) : AKATSUKA

It is certified that error appears in the above-identified patent and that said Letters Patent is hereby corrected as shown below:

COLUMN 3, LINE 11  Delete "$A'_i$ and $A'_i$" and insert --$A'_i$ and $\overline{A'_i}$.--

COLUMN 3, LINE 20  Delete "outputs $A'_i$ and $A'_i$" insert --outputs $A'_i$ and $\overline{A'_i}$--

COLUMN 3, LINE 22  Delete "$A'_i$ and $A'_i$" and insert --$A'_i$ and $\overline{A'_i}$--

COLUMN 7, LINE 19  Delete "receiviang" and insert --receiving--

COLUMN 8, LINE 33, Delete "pwer" and insert --power--

Signed and Sealed this

Fourth Day of October, 1988

Attest:

DONALD J. QUIGG

*Attesting Officer*          *Commissioner of Patents and Trademarks*